(12) United States Patent
Choi et al.

(10) Patent No.: US 11,607,741 B2
(45) Date of Patent: Mar. 21, 2023

(54) SEMICONDUCTOR CHIP BONDING APPARATUS INCLUDING HEAD HAVING THERMALLY CONDUCTIVE MATERIALS

(71) Applicant: SAMSUNG ELECTRONICS CO., LTD., Suwon-si (KR)

(72) Inventors: Sebin Choi, Hwaseong-si (KR); Sunghyup Kim, Hwaseong-si (KR); Sukwon Lee, Yongin-si (KR); Jonggu Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 496 days.

(21) Appl. No.: 16/807,466

(22) Filed: Mar. 3, 2020

(65) Prior Publication Data

US 2021/0069811 A1 Mar. 11, 2021

(30) Foreign Application Priority Data

Sep. 6, 2019 (KR) ........................ 10-2019-0110881

(51) Int. Cl.
*B23K 1/00* (2006.01)
*H01L 23/00* (2006.01)
*B23K 101/40* (2006.01)

(52) U.S. Cl.
CPC ............ *B23K 1/0016* (2013.01); *H01L 24/75* (2013.01); *B23K 2101/40* (2018.08); *H01L 2224/16225* (2013.01); *H01L 2224/75252* (2013.01)

(58) Field of Classification Search
CPC .. B23K 1/0016; B23K 2101/40; B23K 3/047; B23K 3/053; B23K 2101/42; B23K 3/08; H01L 24/75; H01L 2224/16225; H01L 2224/75252; H01L 21/67103; H01L 21/67109; H01L 21/67144; H01L 24/16; H01L 24/32; H01L 24/73; H01L 2221/68363; H01L 21/563; H01L 2224/16145; H01L 2224/32145; H01L 2224/32225; H01L 2224/73204;
(Continued)

(56) References Cited

U.S. PATENT DOCUMENTS 6,940,053 B2 9/2005 Shi
7,176,422 B2 2/2007 Shi
(Continued)

FOREIGN PATENT DOCUMENTS

JP H08-124972 A 5/1996
JP 2004-087704 A 3/2004
(Continued)

*Primary Examiner* — Robert G Bachner
(74) *Attorney, Agent, or Firm* — Sughrue Mion, PLLC

(57) ABSTRACT

Provided a semiconductor chip bonding apparatus including a body, a heater disposed on a lower surface of the body, a collet disposed on a lower surface of the heater, and a head disposed on a lower surface of the collet, the head has a rectangular plate shape, a lower surface and side surfaces of the head are exposed, an upper surface of the head is in contact with the lower surface of the collet, an area of the upper surface of the head is smaller than an area of the lower surface of the collet, the head includes a central section including a recess, and an outer surface constituting a part of the side surfaces of the head, and a peripheral section connected to the recess and disposed on each corners of the head, and a thermal conductivity of the peripheral section is different from that of the central section.

20 Claims, 9 Drawing Sheets

(58) Field of Classification Search
CPC . H01L 2224/75745; H01L 2225/06513; H01L 2225/06565; H01L 24/81; H01L 24/83; H01L 25/50; H01L 2224/81193; H01L 21/6835; H01L 25/0657; H01L 21/67092; H01L 21/67098; H01L 21/67712; H01L 21/67721; H01L 24/741
See application file for complete search history.

(56) References Cited

U.S. PATENT DOCUMENTS

| | | |
|---|---|---|
| 8,177,862 B2 | 5/2012 | Hwang et al. |
| 8,651,359 B2 | 2/2014 | Gaynes et al. |
| 9,252,130 B2 | 2/2016 | Kim et al. |
| 9,282,650 B2 | 3/2016 | Dhavaleswarapu et al. |
| 9,620,476 B2 | 4/2017 | Lee et al. |

FOREIGN PATENT DOCUMENTS

| | | |
|---|---|---|
| JP | 3512575 B2 | 3/2004 |
| JP | 5018455 B2 | 9/2012 |
| JP | 2012-199358 A | 10/2012 |
| KR | 10-2018-0108066 A | 10/2018 |

SEMICONDUCTOR CHIP BONDING APPARATUS INCLUDING HEAD HAVING THERMALLY CONDUCTIVE MATERIALS

CROSS-REFERENCE TO THE RELATED APPLICATION

This application claims priority from Korean Patent Application No. 10-2019-0110881, filed on Sep. 6, 2019 in the Korean Intellectual Property Office, the disclosure of which is incorporated herein by reference.

BACKGROUND

1. Field

Example embodiments of the present disclosure relate to a semiconductor chip bonding apparatus including a head having thermally conductive materials.

2. Description of Related Art

A bonding apparatus is used to bond a semiconductor chip to another semiconductor chip or a substrate. Such a bonding apparatus may pick up a semiconductor chip, and transfer the picked-up semiconductor chip to another semiconductor chip or a substrate. Through thermal pressing, the picked-up semiconductor may then be mounted on the other semiconductor chip or the substrate.

SUMMARY

One or more example embodiments provide a bonding apparatus including a head capable of providing a uniform temperature distribution in a bonding process.

According to an aspect of an example embodiment, there is provided a semiconductor chip bonding apparatus including a body, a heater disposed on a lower surface of the body, a collet disposed on a lower surface of the heater, and a head disposed on a lower surface of the collet, wherein the head has a rectangular plate shape, wherein a lower surface and side surfaces of the head are exposed, wherein an upper surface of the head is in contact with the lower surface of the collet, wherein an area of the upper surface of the head is smaller than an area of the lower surface of the collet, wherein the head includes a central section including a recess concaved toward a center of the head, and an outer surface constituting a part of the side surfaces of the head, and a peripheral section connected to the recess of the central section, the peripheral section disposed on each corners of the head, and wherein a thermal conductivity of the peripheral section is different from a thermal conductivity of the central section According to another aspect of an example embodiment, there is provided a semiconductor chip bonding apparatus including a body, a heater disposed on a lower surface of the body, a collet disposed on a lower surface of the heater, the collet having a plate shape, and a head disposed on a lower surface of the collet, wherein the head is a rectangular plate, wherein a side surface of the head is exposed, wherein an area of the upper surface of the head is smaller than an area of the lower surface of the collet, wherein the collet includes a central vacuum channel extending vertically through the collet, and an outer vacuum channel communicating with the central vacuum channel and extending to the lower surface of the collet, wherein the head includes a central section having a circular, oval or rectangular shape when viewed from a top side, the central section including a thermally conductive material, and a peripheral section disposed to surround an outer surface of the central section, a thermal conductivity of a material of the peripheral section being different from a thermal conductivity of a material of the central section, wherein the central section includes a through hole configured to communicate with the central vacuum channel and extends through the head in a thickness direction of the head, and wherein an area of an upper surface of the peripheral section is equal to 40 to 60% of an area of an upper surface area of the head.

According to another aspect of an example embodiment, there is provided a semiconductor chip bonding apparatus including a body, a heater disposed on a lower surface of the body, a collet disposed on a lower surface of the heater, and a head disposed on a lower surface of the collet, the head having a lower surface disposed at a level that is lower than the lower surface of the collet, wherein the head is a rectangular plate, wherein an area of an upper surface of the head is smaller than an area of a lower surface of the collet, wherein the head includes a central section including a through hole extending through the head in a thickness direction of the head, and a peripheral section connected to an edge of the central section, wherein the peripheral section includes a first peripheral section, a second peripheral section, a third peripheral section, and a fourth peripheral section that are respectively spaced apart from one another by the central section, wherein an area of an upper surface of the peripheral section is equal to 40 to 60% of an area of the upper surface of the head, and wherein a thermal conductivity of a material of the peripheral section is higher than a thermal conductivity of a material of the central section

BRIEF DESCRIPTION OF THE DRAWINGS

The above and/or other objects, features and other advantages of example embodiments will be more clearly understood from the following detailed description taken in conjunction with the accompanying drawings, in which.

DETAILED DESCRIPTION OF THE EMBODIMENTS

Reference will now be made in detail to example embodiments of which are illustrated in the accompanying drawings. The same reference numbers will be used throughout the drawings to refer to the same or like parts.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. As used herein, the term "and/or" includes any and all combinations of one or more of the associated listed items.

Figure 1:
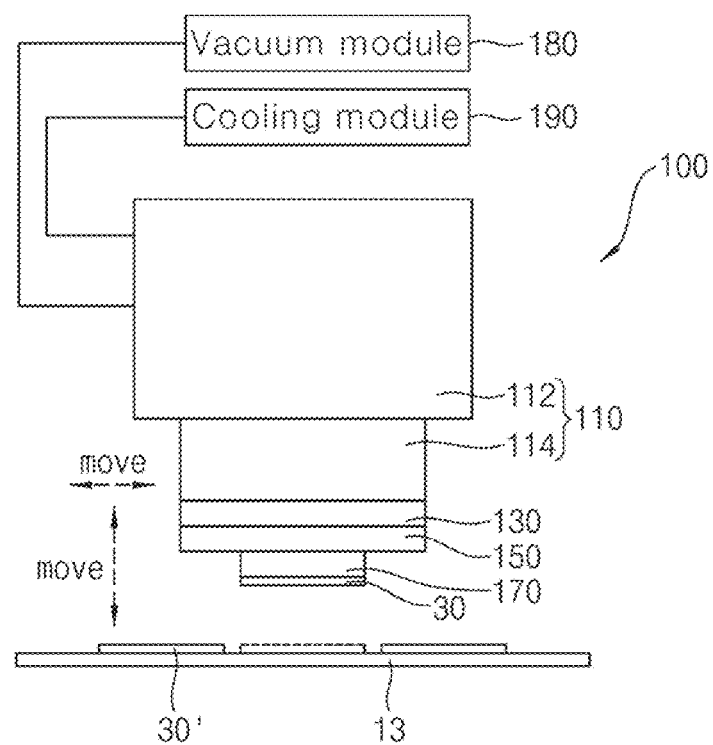
FIG. 1 is a sectional view schematically illustrating a bonding head of a semiconductor chip bonding apparatus according to an example embodiment.

FIG. 1 is a sectional view schematically illustrating a bonding head 100 of a semiconductor chip bonding apparatus 10 according to an example embodiment.

Referring to FIG. 1, the semiconductor chip bonding apparatus 10 according to the illustrated example embodiment may include the bonding head 100, a vacuum module 180, and a cooling module 190.

The bonding head 100 may be mounted to a driver. The bonding head 100 is horizontally and vertically movable by the driver. The bonding head 100 may pick up a plurality of semiconductor chips 30 individualized through a sawing process, and may dispose the picked-up semiconductor chips 30 on a substrate 13 or on other semiconductor chips 30' disposed on the substrate 13 while moving in horizontal and vertical directions by the driver. The semiconductor chip bonding apparatus 10 may directly bond each semiconductor chip 30 picked up by the bonding head 100 to the substrate 13 or to another semiconductor chip 30' disposed on the substrate 13. For example, the substrate 13, to which semiconductor chips 30 will be bonded, may be a substrate such as a carrier substrate, a printed circuit board or a lead frame.

The vacuum module 180 and the cooling module 190 may be connected to the bonding head 100. The vacuum module 180 may include a vacuum pump, a valve, etc. The vacuum module 180 may supply a vacuum pressure to the bonding head 100 such that the bonding head 100 may hold a semiconductor chip 30 by vacuum. The cooling module 190 may include a cooling source, a valve, etc. The cooling module 190 may cool the bonding head 100.

The bonding head 100 may include a body 110, a heater 130, a collet 150, and a head 170. The body 110 may be directly mounted to the driver. The heater 130 may be disposed on a lower surface of the body 110. The collet 150 may be disposed on a lower surface of the heater 130. The head 170 may be disposed on a lower surface of the collet 150.

The body 110 may include a fixed block 112 and an insulation block 114. The fixed block 112 may be directly mounted to the driver. The insulation block 114 may be disposed beneath the fixed block 112. Each of the fixed block 112 and the insulation block 114 may have a rectangular parallelepiped shape, but may not be limited thereto.

A vacuum channel may be provided at the fixed block 112. The vacuum channel may be connected to the vacuum module 180. The vacuum channel may extend to the heater 130 after passing through the insulation block 114. A cooling channel may be provided at the fixed block 112. The cooling channel may be connected to the cooling module 190. The cooling channel may extend to the insulation block 114 or may extend to the heater 130 after passing through the insulation block 114.

The insulation block 114 may prevent or reduce heat generated from the heater 130 between the fixed block 112 and the heater 130 from being transferred to the fixed block 112. For example, the insulation block 114 may include aluminum oxide ($Al_2O_3$).

The heater 130 may be mounted to a lower surface of the insulation block 114. The heater 130 may be a rectangular plate. An area of an upper surface of the heater 130 may be substantially equal to area of a lower surface of the insulation block 113. For example, the heater 130 may be a ceramic heater including an electrical resistance heating wire.

The collet 150 may be mounted to a lower surface of the heater 130. The collet 150 may completely cover the lower surface of the heater 130. An area of an upper surface of the collet 150 may be substantially equal to an area of a lower surface of the heater 130. For example, the collet 150 may include a thermally conductive material such as steel, copper, aluminum, etc.

The head 170 may be mounted to the lower surface of the collet 150. The head 170 may partially cover the lower surface of the collet 150. The area and shape of an upper surface of the head 170 may be substantially the same as area and shape of an upper surface of a semiconductor chip 30 to be picked. However example embodiments are not limited thereto. For example, the upper surface of the head 170 may have an area slightly greater than that of the upper surface of the semiconductor chip 30. For example, an area of the upper surface of the head 170 may be about 1 to 1.1 times an area of the upper surface of the semiconductor chip 30 to be picked up.

Figure 2:
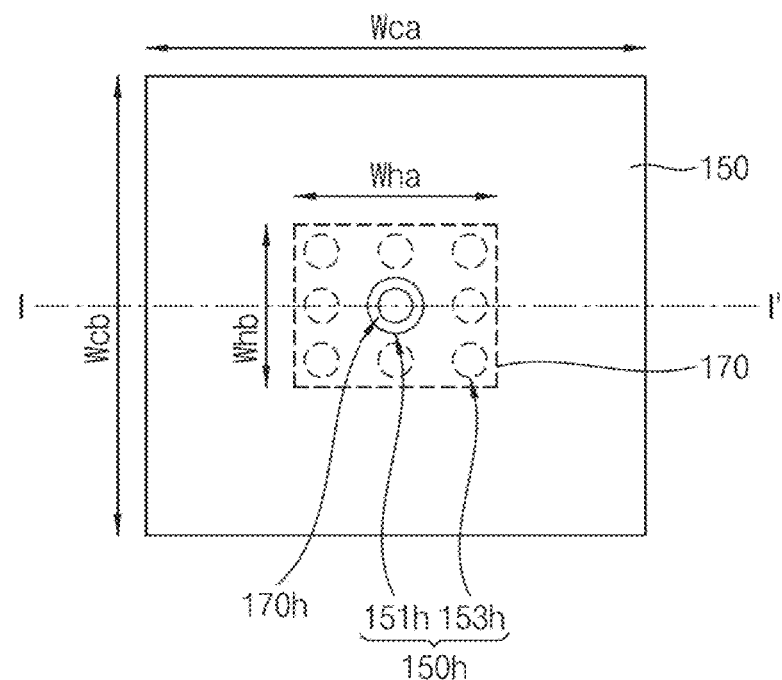
FIG. 2 is a plan view of a collet and a head according to an example embodiment.
Figure 3:
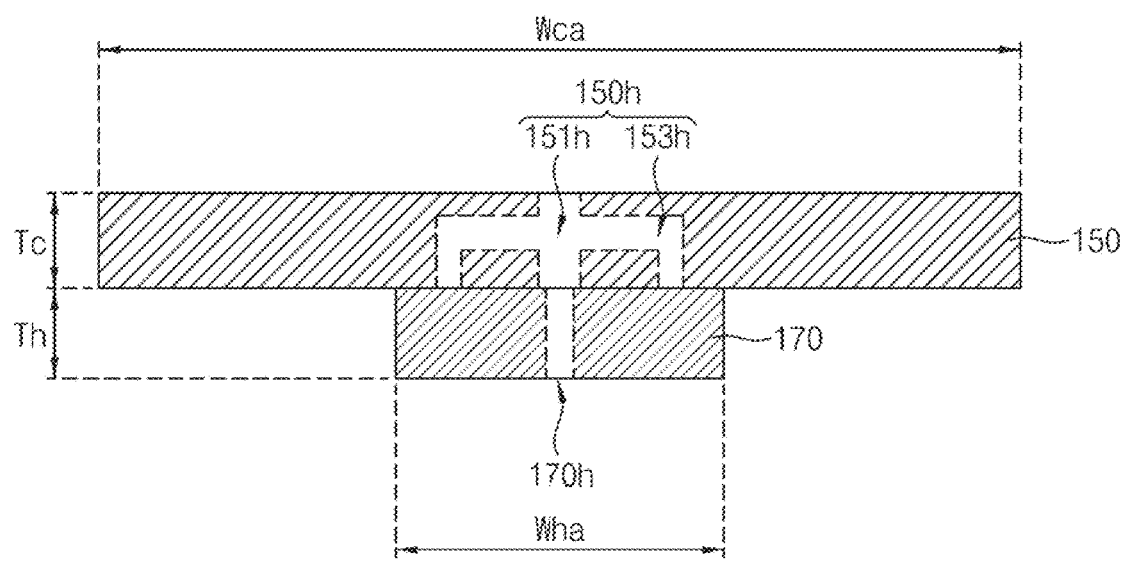
FIG. 3 is an enlarged cross-sectional view taken along line I-I' in FIG. 2.

FIG. 2 is a plan view of the collet 150 to which the head 170 according to the illustrated example embodiment is coupled. FIG. 3 is an enlarged cross-sectional view taken along line I-I' in FIG. 2.

Referring to FIGS. 2 and 3, the collet 150 may be a rectangular plate. For example, the collet 150 may have a rectangular shape at each of the upper surface, lower surface, and side surfaces thereof. Each of the upper surface and the lower surface of the collet 150 may have a square shape having a horizontal length Wca and a vertical length Wcb which are equal to each other. For example, each of the upper surface and the lower surface of the collet 150 may have horizontal length Wca and the vertical length Web of about 30 to 40 mm. The collet 150 may have a thickness Tc equal to about 0.01 to 0.1 times the horizontal length Wca of the upper surface of the collet 150. For example, the thickness Tc of the collet 150 may be about 0.5 to 2 mm. According to an example embodiment, the thickness Tc of the collet 150 may be about 1 mm. When the collet 150 has a thickness of not more than 2 mm, the collet 150 may more rapidly heat the head 170 and a semiconductor chip held by the head 170 by vacuum, using heat received from the heater 130, in a bonding process, and, as such, efficiency of the bonding process may be enhanced. When the collet 150 has a thickness of more than 2 mm, the heating rate of the head 170 may decrease and, as such, productivity of the bonding process may be degraded.

The collet 150 may be formed with a vacuum channel 150h extending through the collet 150 in a thickness direction of the collet 150. In an example embodiment, the vacuum channel 150h may include a central vacuum channel 151h extending vertically through the collet 150, and an outer vacuum channel 153h extending to the lower surface of the collet 150 while being connected to and communicating with the central vacuum channel 151h. The vacuum channel 150h may communicate with the vacuum channel provided in the body 110 and the insulation block 114, as described with reference to FIG. 1. For example, the central vacuum channel 151h of the vacuum channel 150h in the collet 150 may be connected to the vacuum channel provided in the body 110 and the insulation block 114, respectively.

The central vacuum channel 151h may be centrally formed at the collet 150 when viewed from a top side. A plurality of outer vacuum channels 153h may be formed around the central vacuum channel 151h. For example, as illustrated in FIG. 2, nine outer vacuum channels 153h may be formed around one central vacuum channel 151h. Each of the plural outer vacuum channels 153h may communicate with the central vacuum channel 151h and, as such, may be connected to one another through the central vacuum channel 151h. For example, each outer vacuum channel 153h may have an L shape.

All of the plural outer vacuum channels 153h may be formed at positions overlapping with the head 170 when viewed from a top side, respectively. Each outer vacuum channel 153h may be connected, at one end thereof, to the central vacuum channel 151h while being connected, at the other end thereof, to the lower surface of the collet 150. The other end of each outer vacuum channel 153h may be connected to the upper surface of the head 170 contacting the lower surface of the collet 150. In an example embodiment, the vacuum module 180 may hold the collet 150 on the lower surface of the heater 130 by suction by reducing the internal pressure of the outer vacuum channels 153h. The vacuum module 180 may separate the collet 150 from the heater 130 by releasing the pressure-reduced state of the outer vacuum channels 153h.

The head 170 may be a rectangular plate. For example, the head 170 may have a rectangular shape at each of the upper surface, the lower surface, and the side surfaces thereof. The upper surface of the head 170 may be completely covered by the lower surface of the collet 150. The side surface and the lower surface of the head 170 may be exposed without contacting the collet 150.

The head 170 may partially cover the lower surface of the collet 150. For example, each area of the upper surface and the lower surface of the head 170 may be smaller than the area of the lower surface of the collet 150. Each area of the upper surface and the lower surface of the head 170 may be about 5 to 10% of the area of the lower surface of the collet 150. For example, each of the upper surface and the lower surface of the head 170 may have a rectangular shape having a horizontal length Wha of about 10 to 15 mm and a vertical length Whb of about 5 to 10 mm. The head 170 has a thickness Th that may be substantially equal to the thickness of the collet 150. For example, the thickness Th of the head 170 may be about 0.5 to 2 mm. According to an example embodiment, the thickness Th of the head 170 may be about 1 mm.

A through hole 170h may be formed at the center of the head 170. The through hole 170h may extend in a thickness direction of the head 170. The through hole 170h may communicate with the central vacuum channel 151h of the collet 150. The through hole 170h may have a smaller diameter than the central vacuum channel 151h of the collet 150. The through hole 170h may communicate with the vacuum module 180 via the vacuum channel 150h and the central vacuum channel 151h. The vacuum module 180 may hold a semiconductor chip on the lower surface of the head 170 by suction by reducing the internal pressure of the through hole 170h through the vacuum channel 150h.

Figure 4:
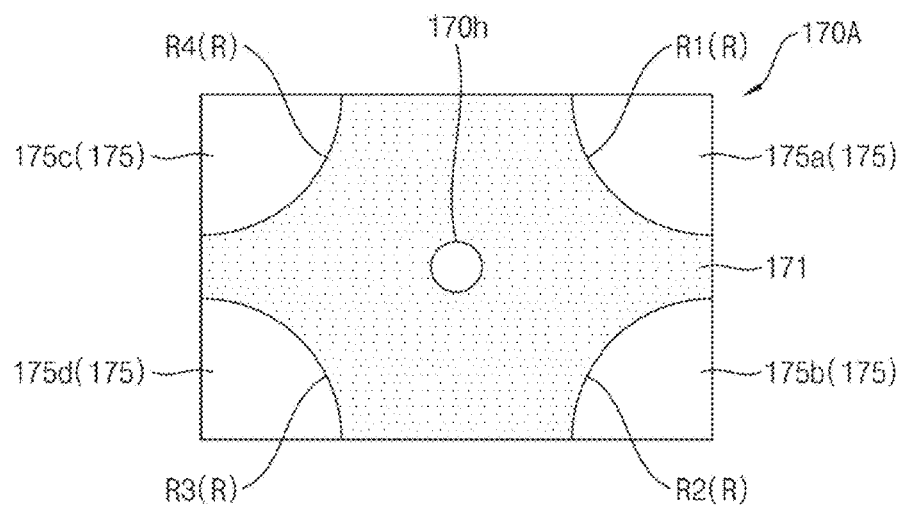
FIG. 4 is a plan view of a head according to an example embodiment.
Figure 5:
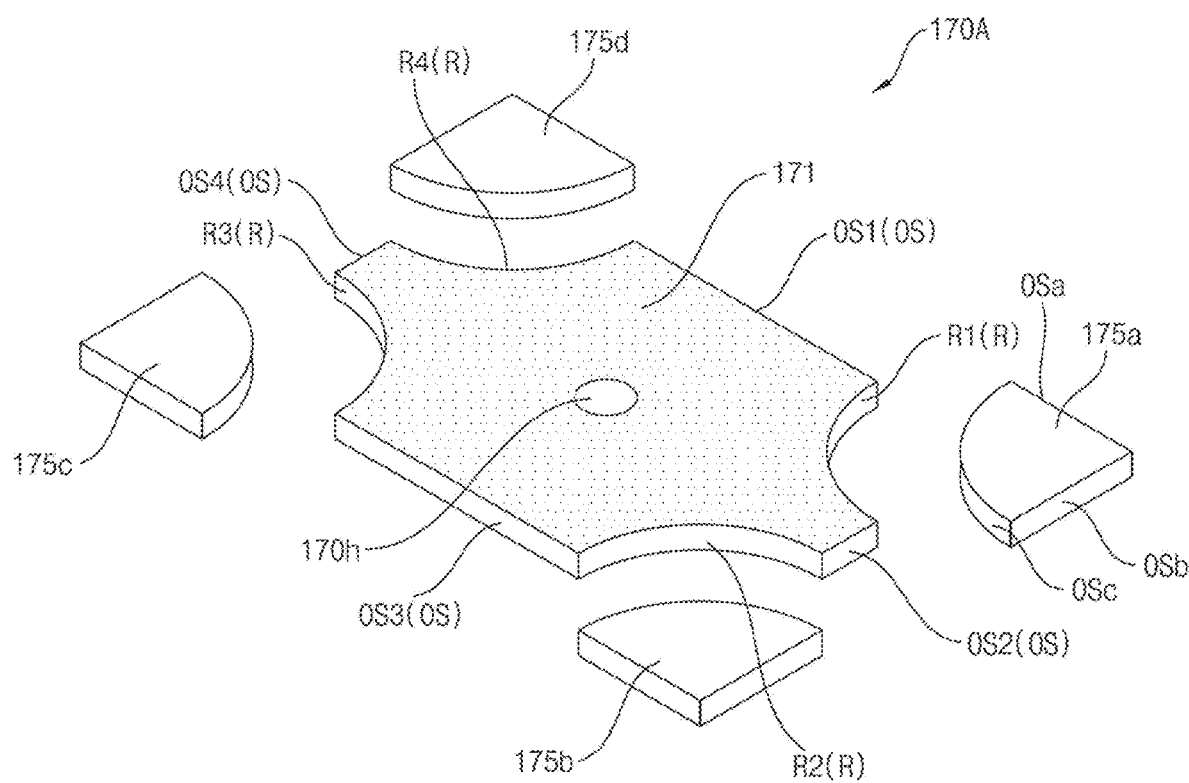
FIG. 5 is an exploded perspective view corresponding to FIG. 4.

FIG. 4 is a plan view of a head 170A according to an example embodiment. FIG. 5 is an exploded perspective view corresponding to FIG. 4.

Referring to FIGS. 4 and 5, the head 170A may include a central section 171 and a peripheral section 175. The central section 171 and the peripheral section 175 may be coupled to form the head 170A which is a rectangular plate. The central section 171 may include a material having thermal conductivity different from that of the peripheral section 175. The peripheral section 175 may include a material having relatively higher thermal conductivity than the central section 171. For example, the central section 171 may include stainless steel, whereas the peripheral section 175 may include aluminum, copper or an alloy of aluminum and copper. However, embodiments are not limited thereto. In an example embodiment, the peripheral section 175 may include a material having relatively lower thermal conductivity than the central section 171. For example, the central section 171 may include aluminum, copper or an alloy of aluminum and copper, whereas the peripheral section 175 may include stainless steel.

The central section 171 may include an outer side surface OS and a recess R. The outer side surface OS may include a first outer side surface OS1, a second outer side surface OS2, a third outer side surface OS3, and a fourth outer side surface OS4 constituting outer side surfaces of the head 170A while being spaced apart from one another. That is, the first to fourth outer side surfaces OS1, OS2, OS3 and OS4 may constitute a part of the outer side surface of the head 170A, and may be exposed outwards.

The recess R may have a recessed shape concaved toward a center of the central section 171. For example, the recess R may be a curved surface concaved toward the center of the central section 171. The recess R may include a first recess R1, a second recess R2, a third recess R3, and a fourth recess R4 connecting adjacent outer side surfaces OS while being spaced apart from one another. For example, the first recess R1 may connect the first outer side surface OS1 and the second outer side surface OS2, the second recess R2 may connect the second outer side surface OS2 and the third outer side surface OS3, the third recess R3 may connect the third outer side surface OS3 and the fourth outer side surface OS4, and the fourth recess R4 may connect the fourth outer side surface OS4 and the first outer side surface OS1, as illustrated in FIG. 5. The recess R may be completely covered by the peripheral section 175.

The peripheral section 175 may be connected to the central section 171 and, as such, may form corners of the head 170A. The peripheral section 175 may contact the recess R of the central section 171 and, as such, may completely cover the recess R. The peripheral section 175 may include a plurality of blocks spaced apart from one another by the central section 171 such that the central section 171 is disposed between adjacent blocks. The plurality of blocks may include a first peripheral section 175*a*, a second peripheral section 175*b*, a third peripheral section 175*c*, and a fourth peripheral section 175*d*. When viewed from a top side, the total area of upper surfaces of the first to fourth peripheral sections 175*a*, 175*b*, 175*c* and 175*d* may be equal to 50 to 60% of the total area of the upper surface of the head 170A.

The first to fourth peripheral sections 175*a*, 175*b*, 175*c* and 175*d* may have a sector shape when viewed from a top side. The first peripheral section 175*a* may include first outer side surface OSa and a second outer side surface OSb forming one corner of the head 170A, and a curved surface OSc contacting the central section 171. The first outer side surface OSa and the second outer side surface OSb may be perpendicular to each other. When viewed from a top side, the first outer side surface OSa and the second outer side surface OSb may have different lengths, respectively. The first outer surface OSa may be coplanar with the first outer surface OS1 of the central section 171. The second outer surface OSb may be coplanar with the second outer surface OS2 of the central section 171. The curved surface OSc may contact the first recess R1 of the central section 171 and, as such, may completely cover the first recess R1. The first to fourth peripheral sections 175*a*, 175*b*, 175*c* and 175*d* may have the same shape. The second to fourth peripheral sections 175*b*, 175*c* and 175*d* may be connected to the second to fourth recesses R2, R3 and R4, respectively. In an example embodiment, the head 170A may be a structure in which the central section 171 and the peripheral section 175 are integrated by welding.

Figure 6:
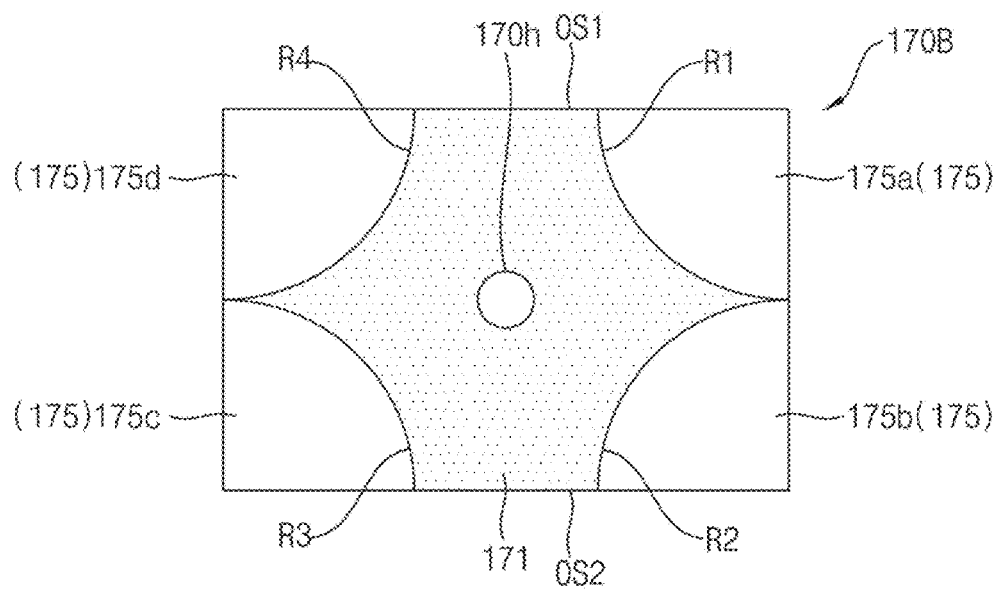
FIG. 6 is a plan view of a head according to an example embodiment.

FIG. 6 is a plan view of a head 170B according to an example embodiment.

Referring to FIG. 6, the central section 171 of the head 170B may include first outer surface OS1 and a second outer side surface OS2, and a first recess R1, a second recess R2, a third recess R3, and a fourth recess R4. The first recess R1 may be connected, at one end thereof, to one end of the second recess R2. The third recess R3 may be connected, at one end thereof, to one end of the fourth recess R4.

The first peripheral section 175*a* and the second peripheral section 175*b* may be disposed to be adjacent to each other. The third peripheral section 175*c* and the fourth peripheral section 175*d* may be disposed to be adjacent to each other. In an example embodiment, the first peripheral section 175*a* and the second peripheral section 175*b* may contact each other, and the third peripheral section 175*c* and the fourth peripheral section 175*d* may contact each other. The total area of upper surfaces of the first to fourth peripheral sections 175*a*, 175*b*, 175*c* and 175*d* may be equal to 50 to 60% of the total area of the upper surface of the head 170B.

Figure 7:
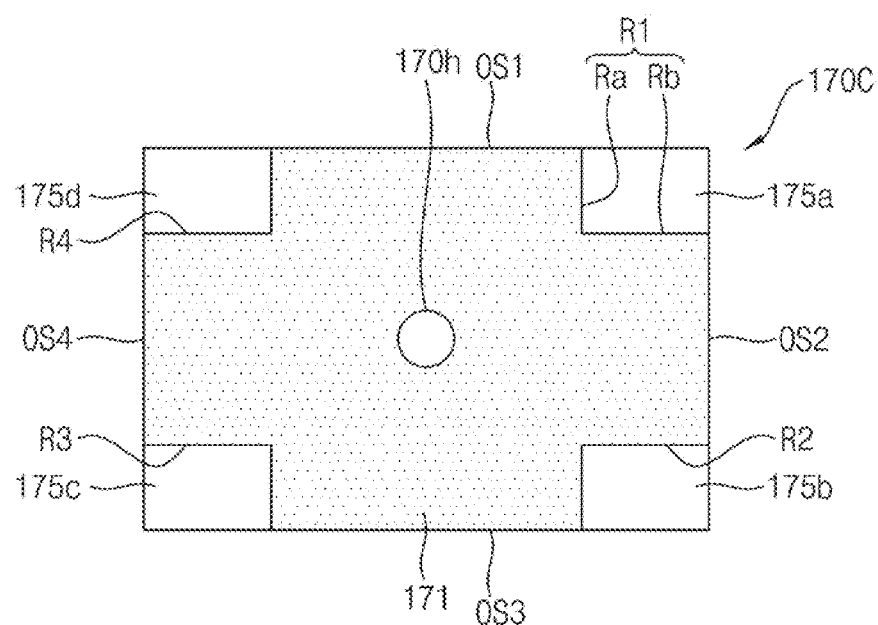
FIG. 7 is a plan view of a head according to an example embodiment.
Figure 8:
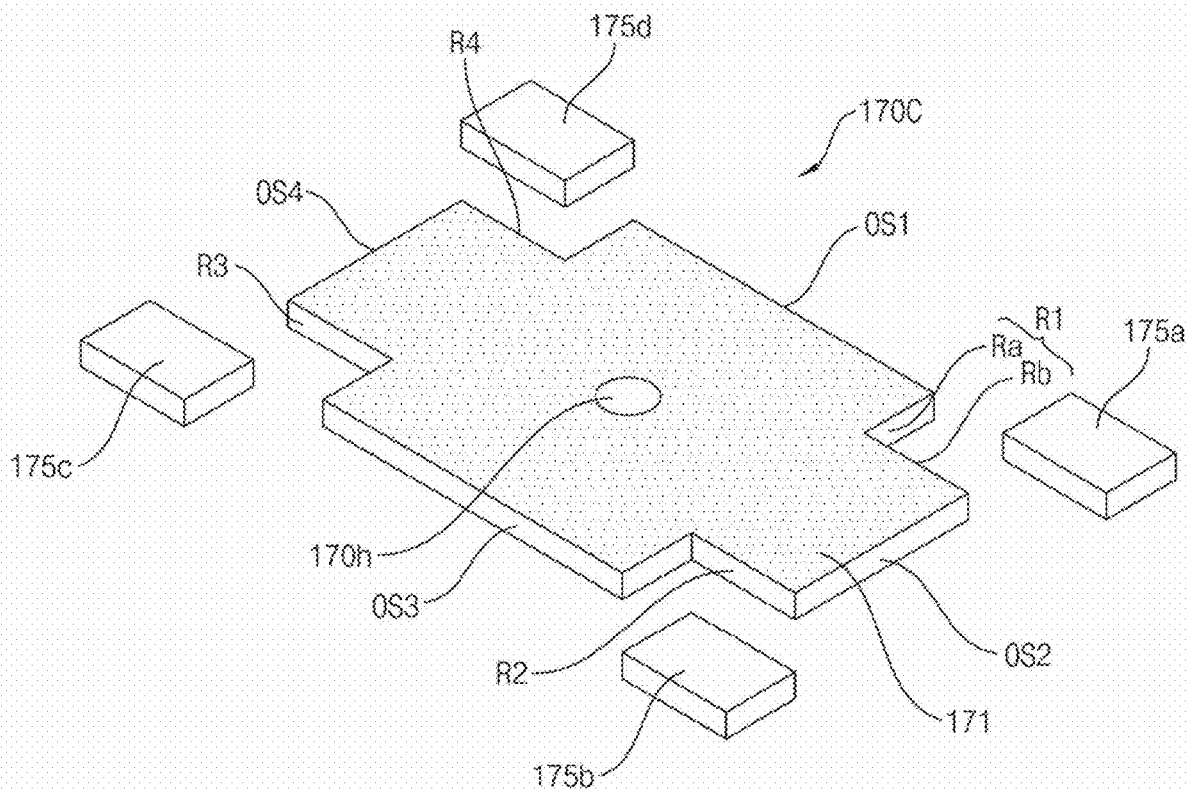
FIG. 8 is an exploded perspective view corresponding to FIG. 7.

FIG. 7 is a plan view of a head 170C according to an example embodiment. FIG. 8 is an exploded perspective view corresponding to FIG. 7.

Referring to FIGS. 7 and 8, the central section 171 of the head 170C may include a first outer side surface OS1, a second outer side surface OS2, a third outer side surface OS3, and a fourth outer side surface OS4, and a first recess R1, a second recess R2, a third recess R3, and a fourth recess R4. The first to fourth recesses R1, R2, R3 and R4 may have a recessed shape concaved toward a center of the central section 171. In an example embodiment, each of the first to fourth recesses R1, R2, R3 and R4 may include first cut-out surface Ra and a second cut-out surface Rb connected to each other while forming a predetermined angle therebetween. For example, the first cut-out surface Ra and the second cut-out surface Rb may be connected to each other at 90°. The central section 171 may have a cross shape when viewed from a top side.

The peripheral section 175 may include a first peripheral section 175*a*, a second peripheral section 175*b*, a third peripheral section 175*c*, and a fourth peripheral section 175*d*. When viewed from a top side, each of the first to fourth peripheral sections 175*a*, 175*b* 175*c* and 175*d* may have a rectangular shape. The total area of upper surfaces of the first to fourth peripheral sections 175*a*, 175*b*, 175*c* and 175*d* may be equal to 50 to 60% of the total area of the upper surface of the head 170C.

Figure 9:
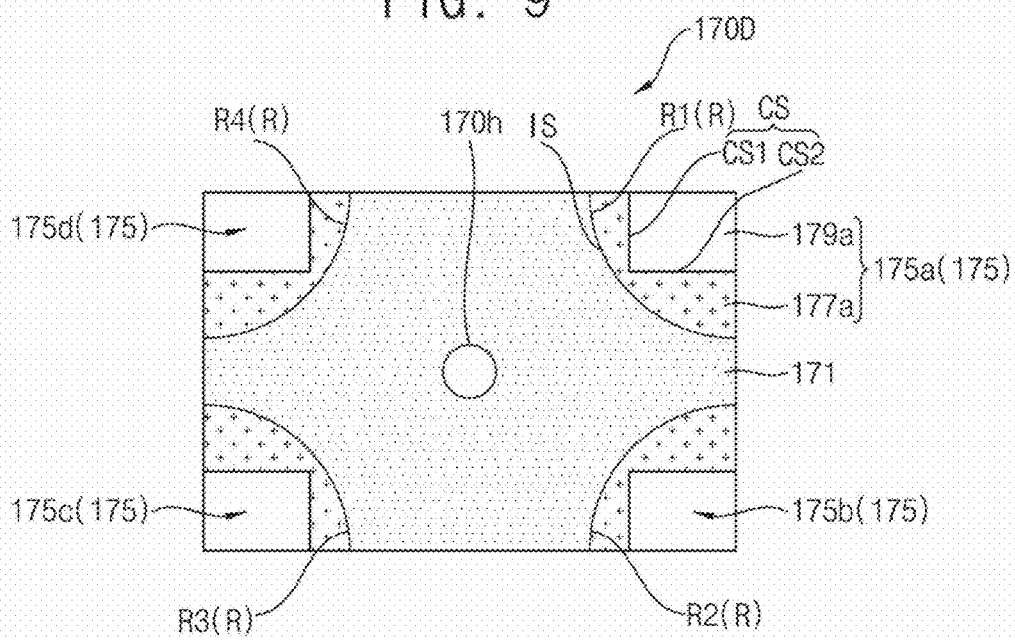
FIG. 9 is a plan view of a head according to an example embodiment.
Figure 10:
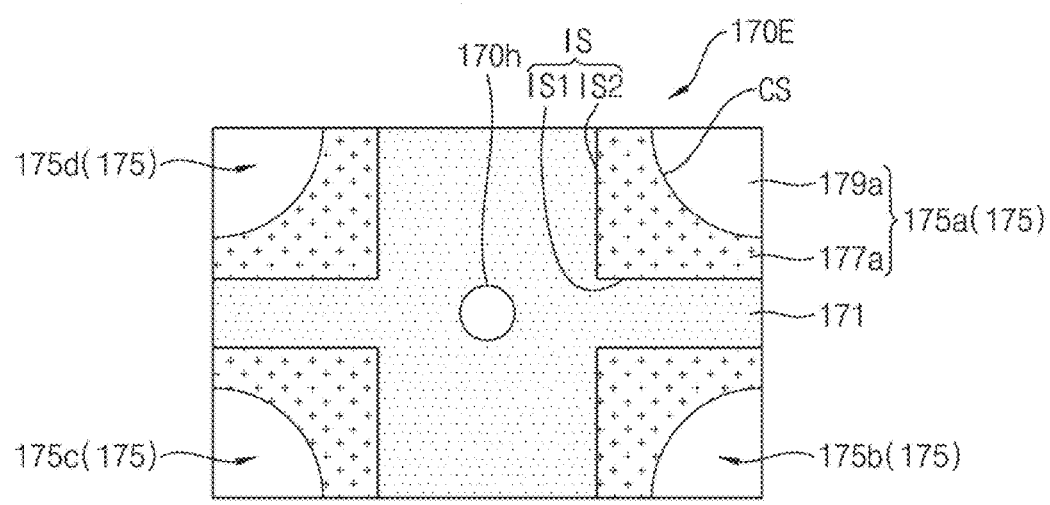
FIG. 10 is a plan view of a head according to an example embodiment.

FIGS. 9 is a plan view of head 170D according to an example embodiment, and FIG. 10 is a plan view of head 170E according to example embodiment.

Referring to FIGS. 9 and 10, each of the heads 170D and 170E may include a central section 171 and a peripheral section 175. The peripheral section 175 may include a first peripheral section 175*a*, a second peripheral section 175*b*, a third peripheral section 175*c*, and a fourth peripheral section 175*d* spaced apart from one another by the central section 171 such that the central section 171 is disposed between adjacent ones of the first to fourth peripheral sections 175*a*, 175*b*, 175*c* and 175*d*. The total area of upper surfaces of the first to fourth peripheral sections 175*a*, 175*b*, 175*c* and 175*d* may be equal to 50 to 60% of the total area of the upper surface of a corresponding one of the heads 170D and 170E.

The first peripheral section 175*a* may include an inner portion 177*a* disposed adjacent to a recess R of the central section 171, and an outer portion 179*a* directly connected to the inner portion 177*a* while being spaced apart from the central section 171. The central section 171, the inner portion 177*a* and the outer portion 179*a* may have different thermal conductivities, respectively. The inner portion 177*a* may include a material having higher thermal conductivity than the central section 171. The outer portion 179*a* may include a material having higher thermal conductivity than the inner portion 177*a*. For example, the central section 171 may include stainless steel, the inner portion 177*a* may include aluminum, and the outer portion 179*a* may include copper or an alloy of aluminum and copper. However, embodiments are not limited thereto. In an example embodiment, the inner portion 177*a* may include a material having lower thermal conductivity than the central section 171. The outer portion 179*a* may include a material having lower thermal conductivity than the inner portion 177*a*. The first to fourth peripheral sections 175*a*, 175*b*, 175*c* and 175*d* may have the same structure.

In an example embodiment, at least one of an inner surface or an outer surface of the inner portion 177*a* may include a curved surface concaved toward an inside of the central section 171.

For example, referring to FIG. 9, the first peripheral section 175*a* may have a sector shape when viewed from a top side. The inner surface of the inner portion 177*a*, that is, an inner surface IS, may be a curved surface concaved toward the center of the central section 171. The outer surface of the inner portion 177*a*, that is, an outer surface CS, may include two side surfaces CS1 and CS2 recessed to be concaved toward the center of the central section 171 while being perpendicular to each other. The outer portion 179*a* may have a rectangular shape when viewed from a top side.

For example, referring to FIG. 10, the first peripheral section 175*a* may have a rectangular shape when viewed from a top side. The inner surface IS of the inner portion 177*a* may include two side surfaces IS1 and IS2 recessed to be concaved toward the center of the central section 171 while being perpendicular to each other. The outer surface CS of the inner portion 177*a* may be a curved surface concaved toward the center of the central section 171. The outer portion 179*a* may have a sector shape when viewed from a top side.

Figure 11:
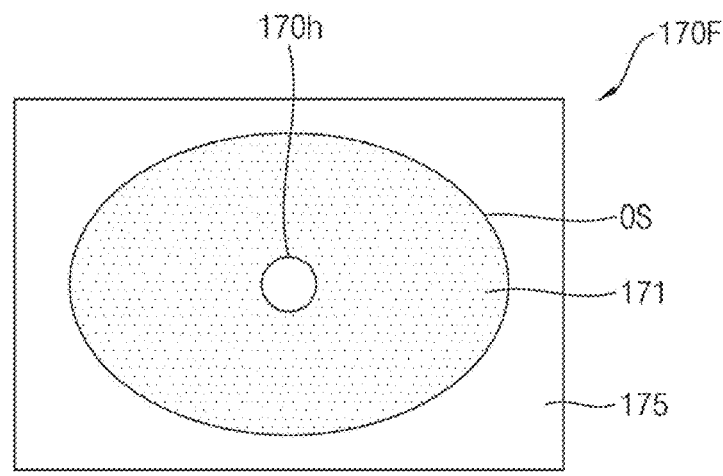
FIG. 11 is a plan view of a head according to an example embodiment.
Figure 12:
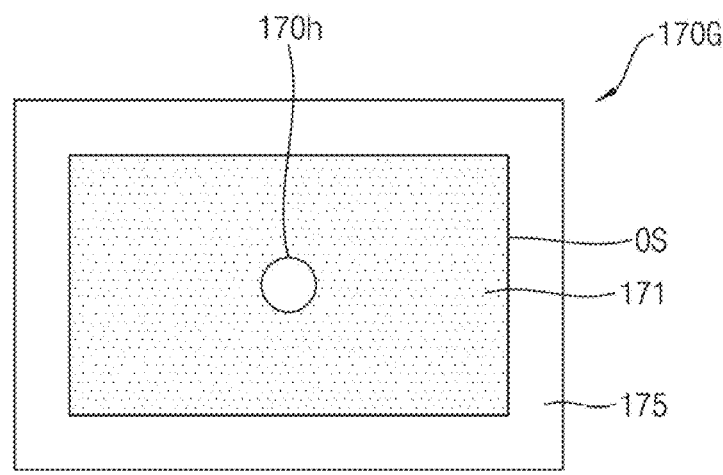
FIG. 12 is a plan view of a head according to an example embodiment.

FIGS. 11 is a plan view of head 170F according to an example embodiment, and FIG. 12 is a plan view of head 170G according to example embodiment.

Referring to FIGS. 11 and 12, each of the heads 170F and 170G may include a central section 171 including a thermally conductive material while having a circular, oval or rectangular shape when viewed from a top side, and a peripheral section 175 including a thermally conductive material different from that of the central section 171 while surrounding an outer surface OS of the central section 171. For example, the peripheral section 175 may have relatively higher thermal conductivity than the central section 171. When viewed from a top side, the area of an upper surface of the peripheral section 175 may be 40 to 60% of the area of the entire upper surface in each of the heads 170F and 170G, respectively. In an example embodiment, the peripheral section 175 may have relatively lower thermal conductivity than the central section 171.

Figure 13:
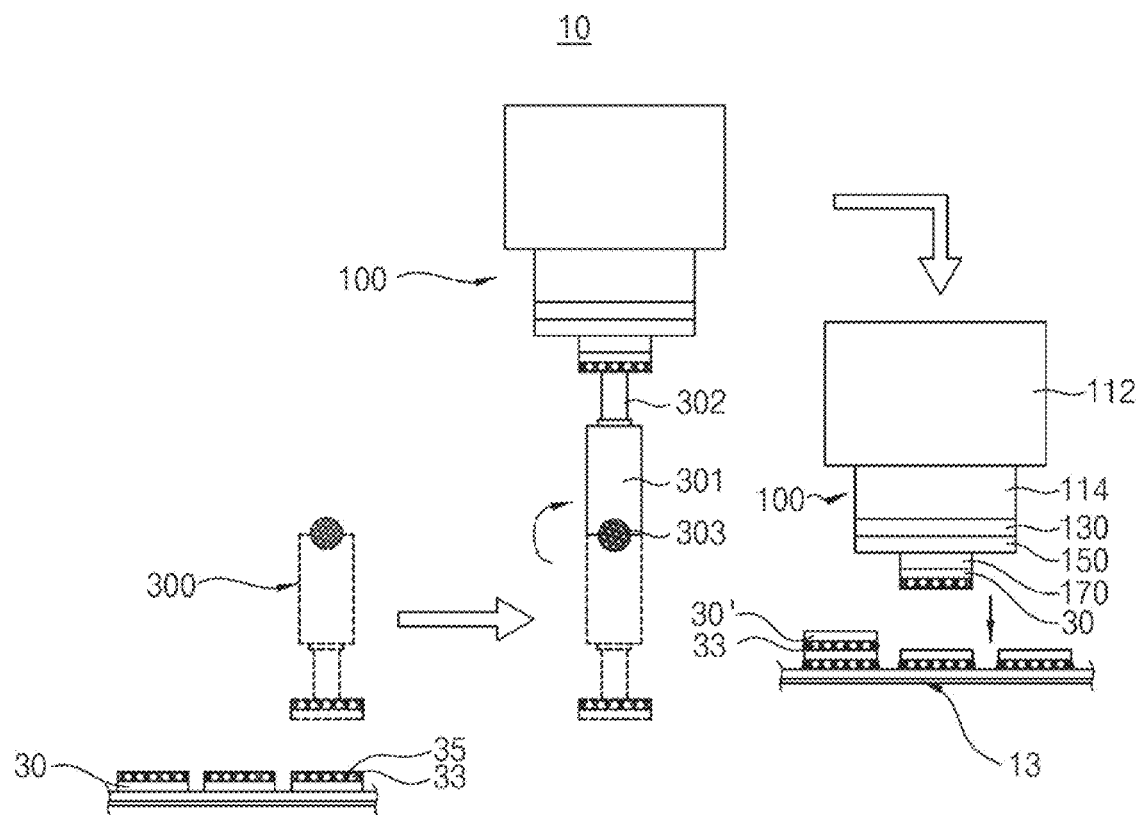
FIGS. 13 and 14 are schematic diagrams illustrating bonding of a semiconductor chip using a semiconductor chip bonding apparatus according to an example embodiment.
Figure 14:
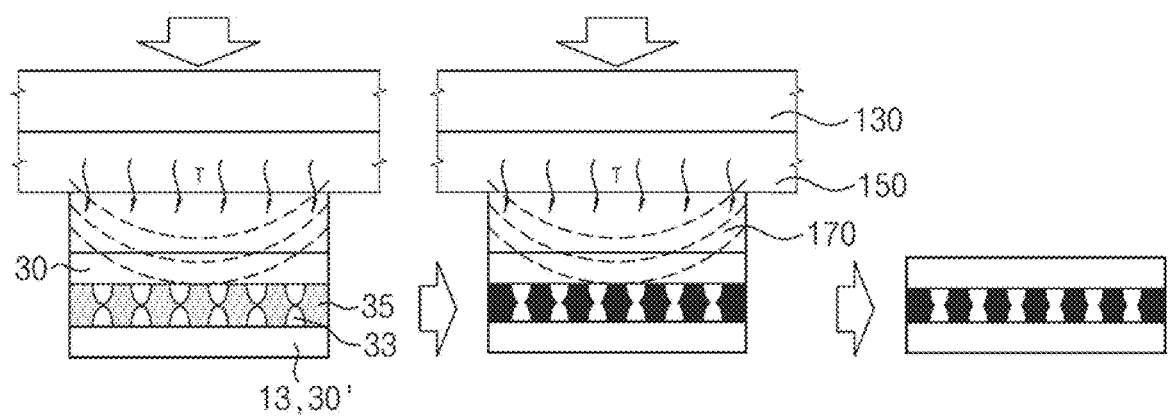

FIGS. 13 and 14 are schematic diagrams illustrating bonding of a semiconductor chip 30 using a semiconductor chip bonding apparatus 10 according to an example embodiment.

Referring to FIG. 13, the semiconductor chip bonding apparatus 10 may include a bonding head 100 and a pick-up head 300. The pick-up head 300 may pick up a semiconductor chip 30. The pick-up head 300 may swing together with the picked-up semiconductor chip 30 such that the picked-up semiconductor chip 30 may be disposed on the bonding head 100.

The pick-up head 300 may include a body 301, a pick-up rod 302, and an axial rod 303. The pick-up rod 302 is connected to one end of the body 301. A suction hole may be formed at a bottom surface of the pick-up rod 302. Upon picking up a semiconductor chip 30, the suction hole is subjected to pressure reduction and, as such, may hold a bump surface of the semiconductor chip 30 thereon by suction. At the bump surface of the semiconductor chip 30, bumps 33 and an underfill 35, that is, a non-conductive film (NCF), covering the bumps 33 may be disposed. The axial rod 303 may be provided at an upper end of the body 301. The body 301 may swing about the axial rod 303. The body 301 may swing about the axial rod 303 through 180° such that the semiconductor chip 30 may be disposed on the underfill 35 under the condition that the bump surface of the semiconductor chip 30 is directed downwards.

The bonding head 100 may transfer the semiconductor chip 30 to a substrate 13 in a state of suction-holding the semiconductor chip 30 by the pick-up head 300. The bonding head 100 may dispose the held semiconductor chip 30 on the substrate 13 or a semiconductor chip 30' previously disposed on the substrate 13.

Referring to FIG. 14, bumps 33 may be disposed on the semiconductor chip 30. In addition, bumps 33 may be disposed on the substrate 13 or the semiconductor chip 30', on which the semiconductor chip 30 will be disposed. However, embodiments are not limited thereto. For example, in place of the bumps 33, conductive pads may be disposed. The bumps 33 may be electrically connected to a circuit structure formed at the semiconductor chip 30 or 30' or the substrate 13 provided with the bumps 33. The underfill 35 may cover the bumps 33 on one surface of the semiconductor chip 30. In an example embodiment, the underfill 35 may also be provided not only on the semiconductor chip 30, but also on the semiconductor chip 30' disposed on the substrate 13.

The underfill 35 may be melted during a bonding process and, as such, may perform an adhesive function for bonding the semiconductor chip 30 and the semiconductor chip 30'. In addition, the underfill 35 may prevent or reduce the substrate 13 from being bent during a bonding process due to a coefficient of thermal expansion difference between the semiconductor chip 30 and the substrate 13. The underfill 35 may be cured after the bonding process and, as such, may perform an underfilling function for filling a space between adjacent bumps 33. Although the melting point of the underfill 35 may be varied in accordance with the material of the underfill 35, the underfill 35 may have a melting point of about 170° C. or more.

A heater 130 of the bonding head 100 may apply heat to a collet 150 and a head 170, thereby heating the semiconductor chip 30 contacting a lower surface of the head 170 to a bonding temperature. In addition, the bonding head 100 may press the semiconductor chip 30 onto the semiconductor chip 30' or the substrate 13. That is, the bonding head 100 may thermally press the picked-up semiconductor chip 30 onto the semiconductor chip 30' or the substrate 13. The underfill 35 is melted by the bonding temperature and, as such, the bumps 33 may be bonded to the bumps 33 or pads on the semiconductor chip 30' or the substrate 13.

The bumps 33 disposed at the semiconductor chip 30 may have an arrangement varying in accordance with a circuit structure provided at the semiconductor chip 30. For example, the bumps 33 on the semiconductor chip 30 may be disposed to have a regular arrangement within a predetermined region having various shapes. When a bonding apparatus in a conventional case picks up a semiconductor chip 30 formed with bumps 33 arranged within a predetermined region and an underfill 35 covering the bumps 33, transfers the picked-up semiconductor chip 30 to a substrate 13 or another semiconductor chip 30', and then heats the semiconductor chip 30 to a bonding temperature, the temperature distribution at an interface between the semiconductor chip 30 and the underfill 35 may be non-uniform. In the case in which circuits in the semiconductor chip 30 and the bumps 33 connected thereto are mainly disposed at a central portion of the semiconductor chip 30, the temperature of the semiconductor chip 30 may be gradually reduced as the semiconductor chip 30 extends from the center thereof to the corners thereof. For example, in each of the cases of FIGS. 4 to 12, the head 170 may be configured such that the central section 171 includes a material having relatively lower thermal conductivity than the peripheral section 175. Heat transferred from the heater 130 to the underfill 35 via the collet 150, the head 170, and the semiconductor chip 30 may exhibit isotropic conduction due to characteristics thereof and, as such, a gradual temperature reduction may be exhibited as the head 170 extends from the center thereof to the corners thereof. In particular, the head 170 may exhibit a lower temperature at a position nearer to a side surface thereof because the side surface of the head 170 is exposed outwards. Furthermore, in a multi-stack semiconductor package in which semiconductor chips 30 are stacked in multiple layers, the semiconductor chips disposed in higher layers exhibit remarkable non-uniformity of temperature distribution, as compared to the semiconductor chip disposed in the lowest layer or the semiconductor chips disposed in lower layers, due to an increase in volume of the stack and an increase in air contact area caused thereby. Due to such causes, in the bonding process, the corner temperature of the head 170 may become lower than the melting point of the underfill 35 that is generally, about 170° C.

Figure 15:
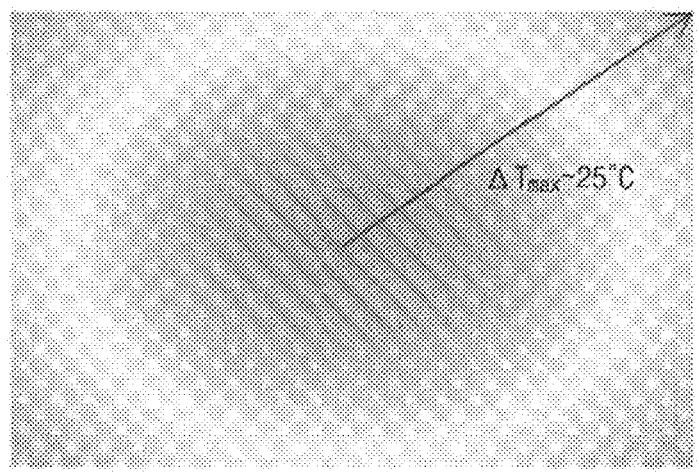
FIGS. 15 to 17 are diagrams showing temperature distribution at an interface between a semiconductor chip and an underfill in the case in which a related bonding apparatus is used.
Figure 15:
Figure 16:
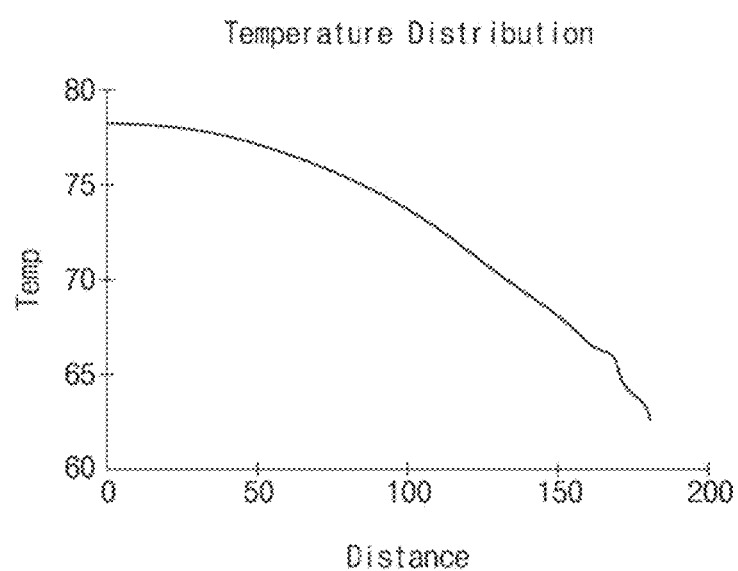
Figure 17:
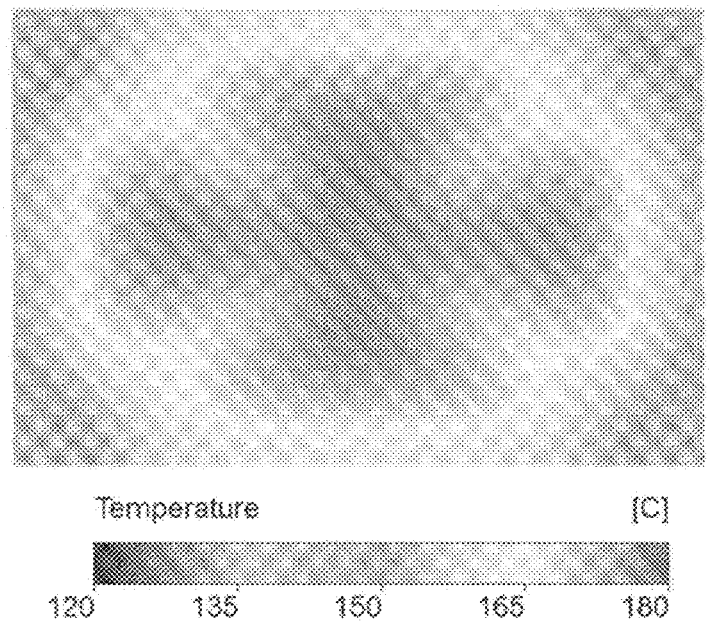

FIGS. 15 to 17 are diagrams showing temperature distribution at the interface between the semiconductor chip and the underfill in the case in which a related bonding apparatus is used. FIG. 16 shows a graph depicting temperature variation exhibited in an arrow direction of FIG. 15.

Referring to FIGS. 15 to 17, temperature distribution at the interface between the semiconductor chip 30 and the underfill 35 in the related case may be identified. High-temperature regions formed in the cases of FIGS. 15 and 17 have different shapes. This is because the semiconductor chips respectively used in the related cases of FIGS. 15 and 17 differ from each other in terms of inner circuit structure and bump arrangement.

On the other hand, in the case in which the circuits in the semiconductor chip 30 and the bumps 33 connected thereto are mainly disposed near an edge of the semiconductor chip 30 when viewed from a top side, the semiconductor chip 30 may exhibit a temperature gradually increasing as the semiconductor chip 30 extends from the center thereof to the corners thereof. For example, in each of the cases of FIGS. 4 to 12, the head may be configured such that the central section 171 includes a material having relatively higher thermal conductivity than the peripheral section 175.

When the temperature difference between the center and the corners in the head 170 is equal to or greater than a predetermined level, the underfill 35 cannot have uniform material properties, and may exhibit reduced bonding force at a portion thereof contacting a relatively low-temperature region. In this case, the portion of the underfill 35 exhibiting weak bonding force may be peeled off due to shrinkage thereof during curing of the underfill 35. As a result, a non-filling phenomenon may occur between the semiconductor chip 30 and the semiconductor chip 30' and/or between the semiconductor chip 30' and the substrate 13.

To this end, example embodiments provide a head 170, in which a material having relatively high thermal conductivity in a predetermined region such that the head 170 has uniform temperature distribution throughout the entirety thereof, and a semiconductor chip bonding apparatus 10 including the head 170.

As described with reference to FIGS. 4 to 12, the semiconductor chip bonding apparatus 10 in the present disclosure may employ heads 170A to 170G each including a central section 171 and a peripheral section 175, which include materials having different thermal conductivities, respectively. The head 170 of the semiconductor chip bonding apparatus 10 may appropriately select any one of the heads 170A to 170G shown in FIGS. 4 to 12 in accordance with the circuit structure and/or the arrangement of bumps 33 in a semiconductor chip 30 to be picked up, and temperature distribution exhibited thereby. For example, in association with the semiconductor chip used in FIGS. 15 and 16, any one of the heads 170F and 170G as in FIGS. 11 and 12 may be effectively used. On the other hand, in association with the semiconductor chip used in FIG. 17, any one of the heads 170A to 170E as in FIGS. 4 and 10 may be effectively used.

Referring to FIG. 15, it may be seen that a low-temperature region is exhibited to be 40 to 60% of the total area. Accordingly, the area of the peripheral section 175 in the head 170 as in FIGS. 11 and 12 may be 40 to 60% of the total area of the head 170. When the area of the peripheral section 175 is less than 40% of the total area of the head 170 or more than 60% of the total area of the head 170, the temperature distribution of the head 170 may be non-uniform throughout the entire area of the head 170. In this case, a non-filling phenomenon of the underfill 35 may occur.

Referring to FIG. 17, it may be seen that a low-temperature region is exhibited to be 50 to 60% of the total area. Accordingly, the area of the peripheral section 175 in the head as in FIGS. 4 to 10 may be 50 to 60% of the total area of the head 170. When the area of the peripheral section 175 is less than 50% of the total area of the head 170 or more than 60% of the total area of the head 170, the temperature distribution of the head 170 may be non-uniform throughout the entire area of the head 170. In this case, a non-filling phenomenon of the underfill 35 may occur.

Figure 18:
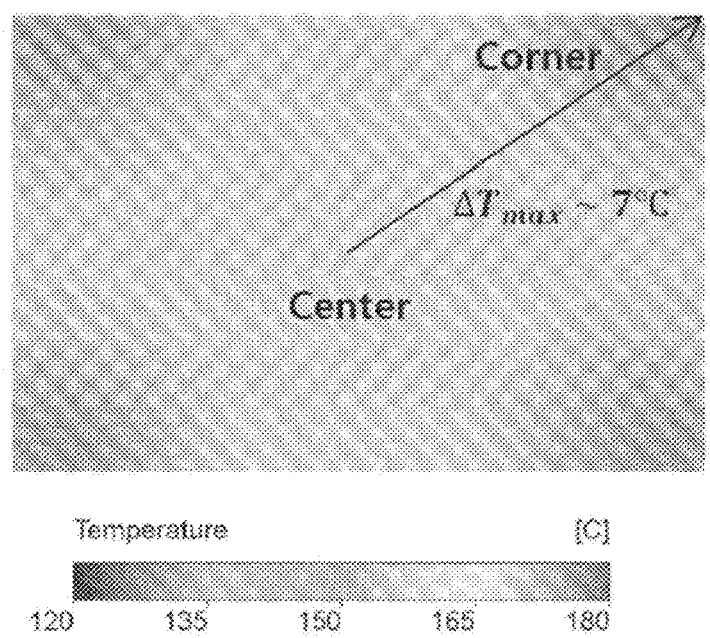
FIG. 18 is a diagram showing temperature distribution at a contact surface between a head and a semiconductor chip in the case of using the bonding apparatus according to example embodiments.

FIG. 18 is a diagram showing temperature distribution at a contact surface between the head and the semiconductor chip 30 in the case of using the bonding apparatus 10 according to each example embodiment of the present disclosure. The temperature distribution of FIG. 18 exhibits results of a bonding process carried out using the head 170A of FIG. 4.

As can be seen from FIG. 18, when the head 170A of FIG. 4 is used, the head 170A has a temperature higher than a melting point of the underfill that is about 170° C. at the corners thereof without having a low-temperature region at the corners.

As apparent from the above description, the semiconductor chip bonding apparatus according to each example embodiment includes a head in which materials having different thermal conductivities are coupled, and, as such, may provide uniform temperature distribution in a bonding process. Accordingly, a uniform bonding property between a semiconductor chip and an underfill may be secured in the bonding process.

While example embodiments have been disclosed for illustrative purposes, those skilled in the art will appreciate that various modifications, additions and substitutions are possible, without departing from the scope and spirit of the disclosure as disclosed in the accompanying claims.

What is claimed is:

1. A semiconductor chip bonding apparatus comprising:
   a body;
   a heater disposed on a lower surface of the body;
   a collet disposed on a lower surface of the heater; and
   a head disposed on a lower surface of the collet,
   wherein the head has a rectangular plate shape,
   wherein a lower surface and side surfaces of the head are exposed,
   wherein an upper surface of the head is in contact with the lower surface of the collet,
   wherein an area of the upper surface of the head is smaller than an area of the lower surface of the collet,
   wherein the head comprises:
      a central section comprising a recess concaved toward a center of the head, and an outer surface constituting a part of the side surfaces of the head, and
      a peripheral section connected to the recess of the central section, the peripheral section disposed on each corners of the head, and
   wherein a thermal conductivity of the peripheral section is different from a thermal conductivity of the central section.

2. The semiconductor chip bonding apparatus according to claim 1, wherein the peripheral section comprises a first peripheral section, a second peripheral section, a third peripheral section, and a fourth peripheral section that are respectively spaced apart from one another by the central section.

3. The semiconductor chip bonding apparatus according to claim 1, wherein the recess of the central section has a curved surface concaved toward an inside of the central section, and
wherein the peripheral section has a sector shape when viewed from a top side.

4. The semiconductor chip bonding apparatus according to claim 1, wherein the recess of the central section comprises a first cut-out surface and a second cut-out surface that are connected to each other and form a predetermined angle therebetween.

5. The semiconductor chip bonding apparatus according to claim 4, wherein the predetermined angle is 90°, and
wherein when viewed from a top side, the central section has a cross shape, and the peripheral section has a rectangular shape.

6. The semiconductor chip bonding apparatus according to claim 1, wherein the central section comprises stainless steel, and
wherein the peripheral section comprises aluminum, copper, or an alloy of aluminum and copper.

7. The semiconductor chip bonding apparatus according to claim 1, wherein a thickness of the head has is 0.5 mm to 2 mm, and
wherein the thickness of the head is equal to a thickness of the collet.

8. The semiconductor chip bonding apparatus according to claim 1, wherein an area of an upper surface of the peripheral section is equal to 50 to 60% of the area of the upper surface of the head.

9. The semiconductor chip bonding apparatus according to claim 1, wherein the peripheral section comprises an inner portion disposed adjacent to the recess of the central section, and an outer portion connected to the inner portion while being spaced apart from the central section, and
wherein a thermal conductivity of a material of the outer portion is higher than a thermal conductivity of a material of the inner portion.

10. The semiconductor chip bonding apparatus according to claim 9, wherein at least one of an inner surface of the inner portion and an outer surface of the inner portion comprises a curved surface concaved towards an inside of the central section.

11. The semiconductor chip bonding apparatus according to claim 1, wherein the peripheral section comprises a material having a thermal conductivity that is higher than the thermal conductivity of the central section.

12. The semiconductor chip bonding apparatus according to claim 1, wherein the peripheral section comprises a material having a thermal conductivity that is lower than the thermal conductivity of the central section.

13. A semiconductor chip bonding apparatus comprising:
a body;
a heater disposed on a lower surface of the body;
a collet disposed on a lower surface of the heater, the collet having a plate shape; and
a head disposed on a lower surface of the collet,
wherein the head is a rectangular plate,
wherein a side surface of the head is exposed,
wherein an area of the upper surface of the head is smaller than an area of the lower surface of the collet,
wherein the collet comprises:
a central vacuum channel extending vertically through the collet, and
an outer vacuum channel communicating with the central vacuum channel and extending to the lower surface of the collet,
wherein the head comprises:
a central section having a circular, oval or rectangular shape when viewed from a top side, the central section comprising a thermally conductive material, and
a peripheral section disposed to surround an outer surface of the central section, a thermal conductivity of a material of the peripheral section being different from a thermal conductivity of a material of the central section,
wherein the central section comprises a through hole configured to communicate with the central vacuum channel and extends through the head in a thickness direction of the head, and
wherein an area of an upper surface of the peripheral section is equal to 40 to 60% of an area of an upper surface of the head.

14. The semiconductor chip bonding apparatus according to claim 13, wherein the area of the upper surface of the head is about 5 to 10% of an area of an upper surface of the collet.

15. The semiconductor chip bonding apparatus according to claim 13, wherein a thickness of the head is equal to a thickness of the collet.

16. The semiconductor chip bonding apparatus according to claim 13, wherein the outer vacuum channel of the collet is disposed to overlap with the head when viewed from a top side.

17. The semiconductor chip bonding apparatus according to claim 13, wherein the central section comprises stainless steel, and the peripheral section comprises aluminum, copper or an alloy of aluminum and copper.

18. The semiconductor chip bonding apparatus according to claim 13, wherein the thermal conductivity of the material of the peripheral section is higher than the thermal conductivity of the material of the central section.

19. A semiconductor chip bonding apparatus comprising:
a body;
a heater disposed on a lower surface of the body;
a collet disposed on a lower surface of the heater; and
a head disposed on a lower surface of the collet, the head having a lower surface disposed at a level that is lower than the lower surface of the collet,
wherein the head is a rectangular plate,
wherein an area of an upper surface of the head is smaller than an area of a lower surface of the collet,
wherein the head comprises:
a central section comprising a through hole extending through the head in a thickness direction of the head, and
a peripheral section connected to an edge of the central section,
wherein the peripheral section comprises a first peripheral section, a second peripheral section, a third peripheral section, and a fourth peripheral section that are respectively spaced apart from one another by the central section,
wherein an area of an upper surface of the peripheral section is equal to 40 to 60% of an area of the upper surface of the head, and
wherein a thermal conductivity of a material of the peripheral section is higher than a thermal conductivity of a material of the central section.

20. The semiconductor chip bonding apparatus according to claim 19, wherein the area of the upper surface of the head is 5 to 10% of an area of an upper surface of the collet, and wherein a thickness of the head is equal to a thickness of the collet.

\* \* \* \* \*